(12) United States Patent
Kunikane et al.

(10) Patent No.: US 11,277,910 B2
(45) Date of Patent: Mar. 15, 2022

(54) WIRING SUBSTRATE

(71) Applicant: IBIDEN CO., LTD., Ogaki (JP)

(72) Inventors: Shigemitsu Kunikane, Ogaki (JP);
Tomoyuki Ikeda, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/941,777

(22) Filed: Jul. 29, 2020

(65) Prior Publication Data

US 2021/0045238 A1 Feb. 11, 2021

(30) Foreign Application Priority Data

Aug. 5, 2019 (JP) .............................. JP2019-143844

(51) Int. Cl.
*H05K 1/03* (2006.01)
*H05K 1/11* (2006.01)
*H05K 1/02* (2006.01)

(52) U.S. Cl.
CPC .......... *H05K 1/0366* (2013.01); *H05K 1/115* (2013.01); *H05K 1/0298* (2013.01); *H05K 1/11* (2013.01)

(58) Field of Classification Search
CPC ...... H05K 1/0366; H05K 1/115; H05K 3/427; H05K 2201/096; H05K 3/4673; H05K 3/4688

See application file for complete search history.

(56) References Cited

U.S. PATENT DOCUMENTS

| 6,376,049 B1* | 4/2002 | Asai | H05K 3/0094 |
| | | | 174/250 |
| 10,813,232 B2* | 10/2020 | Makino | H05K 3/4652 |
| 2008/0107863 A1* | 5/2008 | Ikeda | H01L 21/4857 |
| | | | 428/137 |
| 2014/0311772 A1* | 10/2014 | Mizutani | H05K 3/462 |
| | | | 174/251 |
| 2015/0271917 A1* | 9/2015 | Choi | H05K 3/429 |
| | | | 174/251 |

(Continued)

FOREIGN PATENT DOCUMENTS

WO  WO 2008/053833 A1  5/2008

*Primary Examiner* — Ishwarbhai B Patel
(74) *Attorney, Agent, or Firm* — Oblon, McClelland, Maier & Neustadt, L.L.P.

(57) ABSTRACT

A wiring substrate includes a multilayer core substrate including a core layer, core conductor layers, and core insulating layers, a first laminate formed on first surface of the substrate and including insulating layers and conductor layers such that each insulating layer includes resin without reinforcing material, and a second laminate formed on second surface of the substrate and including insulating layers and conductor layers such that each insulating layer includes resin without reinforcing material. The multilayer core substrate includes through-hole conductors penetrating through the core layer, and via conductors formed on the through-hole conductors and penetrating through the core insulating layers such that the through-hole conductors and via conductors connect outermost core conductor layers on the first and second surface sides, each of the core layer and core insulating layers includes insulating resin including reinforcing material, and the core layer has thickness greater than thickness of each core insulating layer.

20 Claims, 9 Drawing Sheets

(56) References Cited

U.S. PATENT DOCUMENTS

2016/0020163 A1* 1/2016 Shimizu ............ H01L 23/49822
                                                                                     361/768
2016/0172287 A1* 6/2016 Arisaka ............. H01L 23/49816
                                                                                     257/774

* cited by examiner

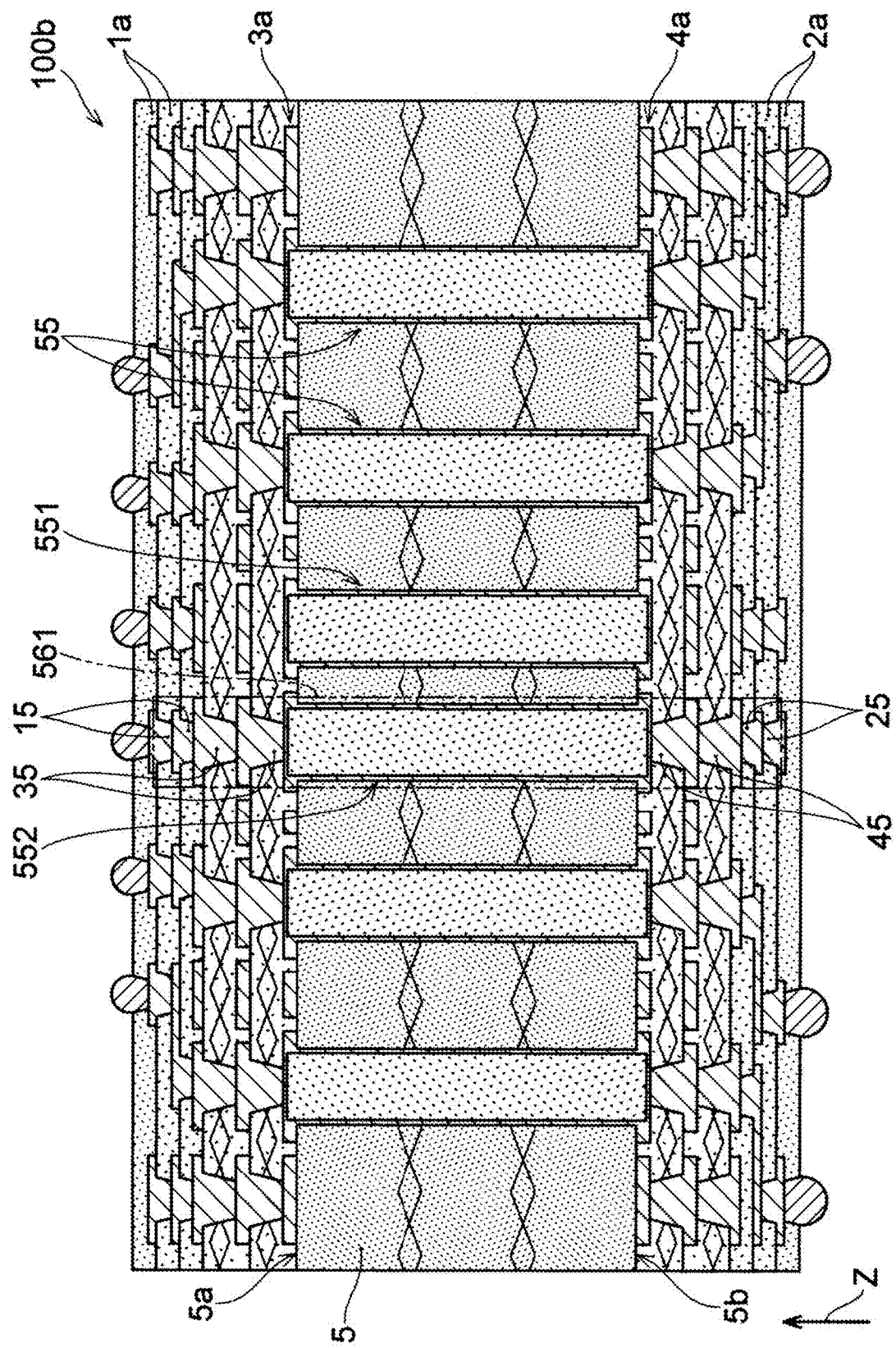

WIRING SUBSTRATE

CROSS-REFERENCE TO RELATED APPLICATIONS

The present application is based upon and claims the benefit of priority to Japanese Patent Application No. 2019-143844, filed Aug. 5, 2019, the entire contents of which are incorporated herein by reference.

BACKGROUND OF THE INVENTION

Field of the Invention

The present invention relates to a wiring substrate.

Description of Background Art

International Publication No. 2008/053833 describes a multilayer printed wiring board that includes a multilayer core substrate including three insulating layers and four conductor circuit layers, and includes two interlayer insulating layers and two conductor circuit layers on each of both sides of the multilayer core substrate. The entire contents of this publication are incorporated herein by reference.

SUMMARY OF THE INVENTION

According to one aspect of the present invention, a wiring substrate includes a multilayer core substrate including a core layer, intra core substrate conductor layers, and intra core substrate insulating layers, a first laminate formed on a first surface of the multilayer core substrate and including insulating layers and conductor layers such that each of the insulating layers includes a resin that does not contain a reinforcing material, and a second laminate formed on a second surface of the multilayer core substrate on the opposite side with respect to the first surface of the multilayer core substrate and including insulating layers and conductor layers such that each of the insulating layers includes a resin that does not contain a reinforcing material. The multilayer core substrate is formed such that the intra core substrate conductor layers are formed on a first surface side and a second surface side of the multilayer core substrate and that the intra core substrate insulating layers are interposed between the intra core substrate conductor layers on the first and second surface sides of the multilayer core substrate, the multilayer core substrate includes through-hole conductors penetrating through the core layer, and via conductors formed on the through-hole conductors and penetrating through the intra core substrate insulating layers on the first and second surface sides of the multilayer core substrate such that the through-hole conductors and the via conductors connect outermost intra core substrate conductor layers on the first and second surface sides in the multilayer core substrate, and the multilayer core substrate is formed such that each of the core layer and intra core substrate insulating layers includes an insulating resin including a reinforcing material and that the core layer has a thickness that is greater than a thickness of each of the intra core substrate insulating layers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is a cross-sectional view illustrating still another example of the wiring substrate according to the embodiment;

DETAILED DESCRIPTION OF THE EMBODIMENTS

Figure 1:
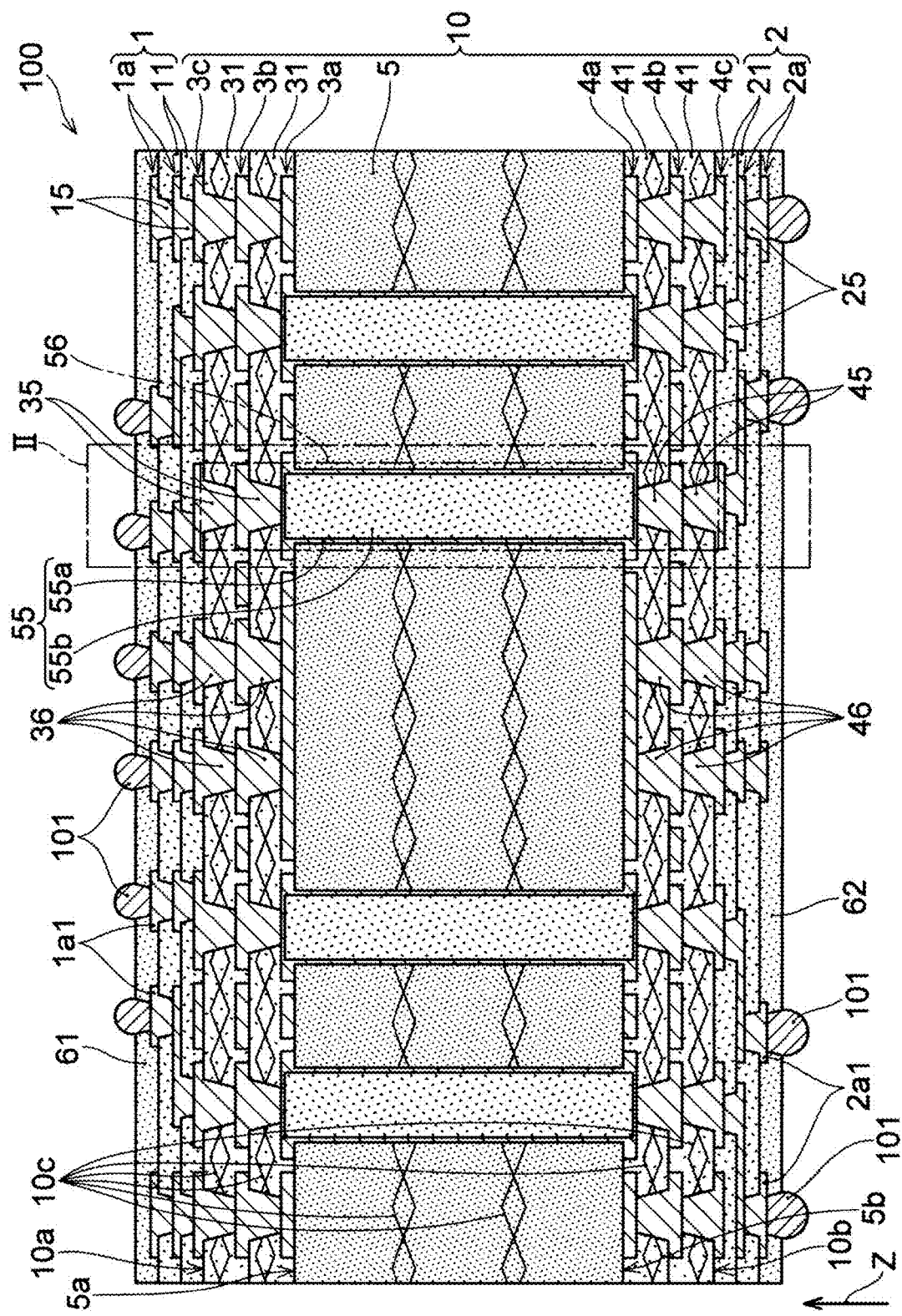
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

FIG. 1 illustrates a cross-sectional view of a wiring substrate 100 which is an example of the wiring substrate according to an embodiment of the present invention.

As illustrated in FIG. 1, the wiring substrate 100 includes: a multilayer core substrate 10 having a first surface (10a) and a second surface (10b) on an opposite side with respect to the first surface (10a); a first laminate 1 formed on the first surface (10a); and second laminate 2 formed on the second surface (10b). The first laminate 1 includes insulating layers 11 and conductor layers (1a) alternately laminated on the first surface (10a) of the multilayer core substrate 10. The second laminate 2 includes insulating layer 21 and conductor layers (2a) alternately laminated on the second surface (10b) of the multilayer core substrate 10. In the example of FIG. 1, the first laminate 1 is formed of two insulating layers 11 and two conductor layers (1a), and the second laminate 2 is formed of two insulating layers 21 and two conductor layers (2a). The insulating layers 11 each include via conductors 15 that connect between conductor layers (for example, between conductor layers (1a), or between an intra core substrate conductor layer (3c) (to be described later) and a conductor layer (1a)) sandwiching an insulating layer 11. The insulating layers 21 each include via conductors 25 that connect between conductor layers (for example, between conductor layers (2a), or between an intra core substrate conductor layer (4c) (to be described later) and a conductor layer (2a)) sandwiching an insulating layer 21.

The multilayer core substrate 10 includes a core layer 5 that forms a central portion of the multilayer core substrate 10 in a thickness direction, and conductor layers (intra core substrate conductor layers (3a-3c) and intra core substrate conductor layers (4a-4c)) and insulating layers (intra core substrate insulating layers (31, 41)) that are alternately laminated on the core layer 5. The core layer 5 has a first base surface (5a) facing the first surface (10a), and a second base surface (5b) facing the second surface (10b). In the example of FIG. 1, on the first base surface (5a), the intra core substrate conductor layer (3a) (first conductor layer), the intra core substrate conductor layer (3b), and the intra core substrate conductor layer (3c) (third conductor layer), and the two intra core substrate insulating layers 31 interposed between the intra core substrate conductor layers (3a-3c) are alternately laminated. And, on the second base surface (5b), the intra core substrate conductor layer (4a) (second conductor layer), the intra core substrate conductor layer (4b), and the intra core substrate conductor layer (4c) (fourth conductor layer), and the two intra core substrate insulating layers 41 interposed between the intra core substrate conductor layers (4a-4c) are alternately laminated. The "multilayer core substrate" is also simply referred to as the "core substrate" in the following description.

The intra core substrate conductor layer (3a) is formed on the first base surface (5a), and the intra core substrate conductor layer (4a) is formed on the second base surface (5b). The intra core substrate conductor layer (3a) and the intra core substrate conductor layer (4a) are the innermost conductor layers of the wiring substrate 100 and the core substrate 10. Further, in the example of FIG. 1, the intra core substrate conductor layer (3c) is the outermost conductor layer on the first surface (10a) side of the core substrate 10, and the intra core substrate conductor layer (4c) is the outermost conductor layer on the second surface (10b) side of the core substrate 10.

In the description of the wiring substrate according to the present embodiment (for example, the wiring substrate 100), a side farther from the core layer 5 in the thickness direction of the wiring substrate is also referred to as an "upper side" or simply "upper," and a side closer to the core layer 5 is also referred to as a "lower side" or simply "lower." Further, for the conductor layers and the insulating layers, a surface facing an opposite side with respect to the core layer 5 is also referred to as an "upper surface," and a surface facing the core layer 5 side is also referred to as a "lower surface." Therefore, in the description of the first laminate 1 and the second laminate 2, a side farther from the core substrate 10 is also referred to as an "upper side" or simply "upper," and a side closer to the core substrate 10 is also referred to as a "lower side" or simply "lower." Further, in the description of the embodiments, the thickness direction of the wiring substrate is also simply referred to as a "Z direction."

The wiring substrate 100 can be efficiently manufactured by using as a starting substrate a substrate including the core layer 5 and forming the conductor layers and the insulating layers on both sides of the core layer 5. In the present embodiment, a thickness of the core layer 5 that can form a starting substrate when the wiring substrate 100 is manufactured is larger than a thickness of each of the multiple intra core substrate insulating layers (31, 41). Further, the core layer 5 is formed of an insulating resin containing a reinforcing material (10c). Since the core layer 5 is thicker than each of the intra core substrate insulating layers (31, 41) and contains the reinforcing material (10c), warpage is unlikely to occur in the wiring substrate 100 during manufacturing, even in an initial process of the manufacturing of the wiring substrate 100. Therefore, warpage of the wiring substrate 100 after completion is thought to be suppressed.

Although rigidity of the wiring substrate 100 during a manufacturing process and after completion can be further increased by making the thickness of each of the intra core substrate insulating layers (31, 41) similar to the thickness of the core layer 5, the core substrate 10 and the wiring substrate 100 may become excessively thick. Further, when upper and lower conductor layers of each of the intra core substrate insulating layers (31, 41) are electrically connected, electrical resistance of the connection path may become excessively large. Therefore, in the present embodiment, the thickness of the core layer 5 is relatively larger than the thickness of each of the intra core substrate insulating layers (31, 41).

The thickness of the core layer 5 is, for example, 10 or more times and 20 or less times the thickness of each of the intra core substrate insulating layers 31 and the intra core substrate insulating layers 41. Further, the thickness of the core layer 5 is 20 or more times and 50 or less times a thickness of each of the insulating layers 11 included in the first laminate 1 and the insulating layers 21 included in the second laminate 2. When the core layer 5 has such a thickness, warpage of the wiring substrate 100 is likely to be suppressed, and the thickness of the wiring substrate 100 is unlikely to become excessively large with respect to a desired thickness.

Further, in the present embodiment, the intra core substrate insulating layers (31, 41) are each formed of an insulating resin containing a reinforcing material (10c). Further, in the example of FIG. 1, the thickness of each of the intra core substrate insulating layers (31, 41) is larger than the thickness of each of the insulating layers 11 included in the first laminate 1, and is larger than the thickness of each of the insulating layers 21 included in the second laminate 2. Therefore, during a manufacturing process of the wiring substrate 100, the rigidity of the wiring substrate 100 during manufacturing is increased from a relatively early stage, and, for example, even when the wiring substrate 100 is subjected a mechanical stress and/or a thermal stress during a subsequent process, warpage is unlikely to occur. Therefore, warpage of the wiring substrate 100 is thought to be suppressed.

On the other hand, the insulating layers 11 included in the first laminate 1 and the insulating layers 21 included in the second laminate 2 are each formed of a resin that does not contain a reinforcing material. Further, in the example of FIG. 1, the thickness of each of the insulating layers 11 and the insulating layers 21 is smaller than the thickness of each of the intra core substrate insulating layers (31, 41) and the thickness of the core layer 5. Since the insulating layers 11 and the insulating layers 21 do not each contain a reinforcing material such as a glass fiber, a conductor film such as a plating film can be stably formed on each of the insulating layers 11 and the insulating layers 21 without using a metal foil or the like. Therefore, the relatively thin conductor layers (1*a*) or conductor layers (2*a*) can be formed. Further, since the insulating layers 11 and the insulating layers 21 are relatively thin, the via conductors (15, 25) each having a relatively small diameter can be provided. That is, the conductor layers in the first laminate 1 or the second laminate 2 can be provided with conductor patterns formed at finer pitches as compared to the intra core substrate conductor layers.

The thickness of the core layer 5 is, for example, 500 µm or more and 2000 µm or less. Further, the thickness of each of the intra core substrate insulating layers (31, 41) is, for example, 40 µm or more and 200 µm or less. Further, the thickness of each of the insulating layers (11, 21) is, for example, 10 µm or more and less than 40 µm. When the insulating layers have such thicknesses, the thickness of the wiring substrate 100 does not become excessively large, and, as described above, warpage of the wiring substrate 100 is suppressed, and the first and second laminates (1, 2) can each be provided with conductor patterns formed at a fine pitch.

In the present embodiment, the core substrate 10 further includes through-hole conductors 55 included in the core layer 5, via conductors 35 included in the intra core substrate insulating layers 31, and via conductors 45 included in the intra core substrate insulating layers 41. The through-hole conductors 55 penetrate the core layer 5, and connect the intra core substrate conductor layer (3*a*) on the first base surface (5*a*) and the intra core substrate conductor layer (4*a*) on the second base surface (5*b*) to each other. Each through-hole conductor 55 includes a conductor film (55*a*) formed on an inner wall of a through hole provided in the core layer 5 and a filling material (55*b*) filled inside the each through-hole conductor 55.

The via conductors 35 and the via conductors 45 are formed at positions overlapping the through-hole conductors 55 in a plan view, and are electrically connected to the through-hole conductors 55. The term "plan view" means viewing the wiring substrate 100 along the Z direction. Each via conductor 35 penetrates an intra core substrate insulating layer 31 that includes the each via conductor 35, and connects to each other the conductor layers that sandwich the intra core substrate insulating layer 31. Each via conductor 45 penetrates an intra core substrate insulating layer 41 that includes the each via conductor 45, and connects to each other the conductor layers that sandwich the intra core substrate insulating layer 41.

Then, the intra core substrate conductor layer (3*c*) and the intra core substrate conductor layer (4*c*) are electrically connected to each other via penetrating conductors 56 which are laminates of the via conductors (35, 45) included in the intra core substrate insulating layers (31, 41) and the through-hole conductors 55. The penetrating conductors 56 are formed by the through-hole conductors 55 and the via conductors (35, 45) stacked on the through-hole conductors 55, and each extend along the thickness direction of the core substrate 10.

Therefore, according to the present embodiment, the outermost conductor layers (the intra core substrate conductor layer (3*c*) and the intra core substrate conductor layer (4*c*)) on the first surface (10*a*) side and the second surface (10*b*) side of the core substrate 10 are connected to each other via a substantially shortest path. That is, in the present embodiment, although the core substrate 10 including the relatively thick core layer 5 may become relatively thick, the outermost conductor layers of the core substrate 10 can be electrically connected to each other via a substantially shortest path having a small electrical resistance via the penetrating conductors 56.

Further, the intra core substrate conductor layer (3*a*) on the first base surface (5*a*) and the intra core substrate conductor layer (4*a*) on the second base surface (5*b*) are connected to each other by one through-hole conductor 55 in the thickness direction. As compared to a laminate of via conductors respectively provided in multiple thin insulating layers laminated to achieve the same thickness as the core layer 5, one through-hole conductor 55 in the thickness direction has less variation in characteristic impedance in the thickness direction of the core layer 5. That is, the outermost conductor layers of the core substrate 10 can be electrically connected to each other via a path having less reflection or attenuation of a high frequency signal and having good transmission characteristics.

In the example of FIG. 1, on the first base surface (5*a*), the intra core substrate conductor layer (3*a*), the lower side intra core substrate insulating layer 31, the intra core substrate conductor layer (3*b*), the upper side intra core substrate insulating layer 31 and the intra core substrate conductor layer (3*c*) are laminated in this order. The upper surfaces of the upper side intra core substrate insulating layer 31 and the intra core substrate conductor layer (3*c*) form the first surface (10*a*) of the core substrate 10. The first laminate 1 is formed on the first surface (10*a*).

Further, on the second base surface (5*b*), the intra core substrate conductor layer (4*a*), the lower side intra core substrate insulating layer 41, the intra core substrate conductor layer (4*b*), the upper side intra core substrate insulating layer 41 and the intra core substrate conductor layer (4*c*) are laminated in this order. The upper surfaces of the upper side intra core substrate insulating layer 41 and the intra core substrate conductor layer (4*c*) form the second surface (10*b*) of the core substrate 10. The second laminate 2 is formed on the second surface (10*b*).

The first and second laminates (1, 2) are build-up layers respectively formed on the first surface (10*a*) and the second surface (10*b*) of the core substrate 10 in the wiring substrate 100. The intra core substrate conductor layers (3*b*, 3*c*, 4*b*, 4*c*) and the intra core substrate insulating layers (31, 41) can also be formed on the first base surface (5*a*) or the second base surface (5*b*) using a build-up manufacturing method.

The first laminate 1 and the second laminate 2 may each include three or more conductor layers and three or more insulating layers, or may each include only one conductor layer and only one insulating layer. Further, the core substrate 10 may include more or less than 6 intra core substrate conductor layers, or may include more or less than 4 intra core substrate insulating layers, in total on the first surface (10*a*) side and the second surface (10*b*) side.

In the wiring substrate 100, the intra core substrate conductor layers, and the conductor layers in the first and second laminates (1, 2), can have arbitrary conductor patterns. In the example of FIG. 1, of the two conductor layers (1*a*) of the first laminate 1, the conductor layer (1*a*) on the surface-layer side (outer side) includes connection pads (1*a*1) for mounting an external electronic component (not illustrated in the drawings) or the like. A solder resist layer 61 is formed on the first laminate 1. The solder resist layer 61 has openings exposing the connection pads (1*a*1). On the other hand, of the two conductor layers (2*a*) of the second laminate 2, the conductor layer (2*a*) on the surface-layer side (outer side) includes connection pads (2*a*1) for connecting to an external motherboard (not illustrated in the drawings) or the like. A solder resist layer 62 is formed on the second laminate 2. The solder resist layer 62 has openings exposing the connection pads (2a1).

The solder resist layers (61, 62) can be formed using any insulating material. The solder resist layers (61, 62) are formed by using, for example, a photosensitive resin containing an epoxy resin, a polyimide resin or the like as a main raw material.

In the example of FIG. 1, bumps 101 are respectively provided on the multiple connection pads (1a1) and connection pads (2a1). The bumps 101 are formed of any metal such as solder, copper, or tin, and are used for connecting to an external electronic component or motherboard (not illustrated in the drawings). In the present embodiment, as described above, warpage of the wiring substrate 100 can be suppressed, and, thus, high uniformity (bump coplanarity) with respect to heights of the multiple bumps 101 can be easily achieved. Therefore, good quality of the connection between the wiring substrate 100 and an external electronic component or the like can be obtained. The bumps 101 do not necessarily have to be provided. When the bumps 101 are not provided, a surface protective film (not illustrated in the drawings) formed of Au, Ni/Au, Ni/Pd/Au, solder, or heat resistant preflux may be formed on an exposed surface of each of the connection pads (1a1, 2a1).

The core layer 5, the intra core substrate insulating layers, and the insulating layers 11 and the insulating layers 21 are formed of any insulating resin. Examples of insulating resins include an epoxy resin, a bismaleimide triazine resin (BT resin), a phenol resin, and the like. The core layer 5 and the insulating layers formed using these insulating resins may contain an inorganic filler such as silica. As described above, in the present embodiment, the core layer 5 and the intra core substrate insulating layers each contain a reinforcing material (10c), and the insulating layers 11 and the insulating layers 21 do not each contain a reinforcing material. Examples of the reinforcing material (10c) include, but are not limited to, a glass fiber, an aramid fiber, a glass nonwoven fabric, an aramid nonwoven fabric, and the like.

In the example of FIG. 1, in addition to the via conductors 35, the intra core substrate insulating layers 31 include via conductors 36 that are formed at positions that do not overlap with the through-hole conductors 55 in a plan view. Further, in addition to the via conductors 45, the intra core substrate insulating layers 41 include via conductors 46 that are formed at positions that do not overlap with the through-hole conductors 55 in a plan view. In this way, the intra core substrate insulating layers may include via conductors that do not overlap with the through-hole conductors 55 in a plan view, and/or via conductors that are not electrically connected to the through-hole conductors 55.

Each of the via conductors (15, 25) in the first laminate 1 or the second laminate 2 and the via conductors (35, 36, 45, 46) in the core substrate 10 is a so-called filled via that is formed by filling a conductor in a through hole penetrating an insulating layer that includes the each of the via conductors. Each of the via conductors is integrally formed with a conductor layer on an upper side of the each of the via conductors.

The intra core substrate conductor layers (3a-3c), the intra core substrate conductor layers (4a-4c), and the conductor layers (1a) and the conductor layers (2a) can each be formed of, for example, a metal foil, a vapor-deposited film, or a plating film alone containing copper, nickel, silver, palladium or the like, or are each formed of a laminate of these foils and films. That is, in FIG. 1, these conductor layers are simplified for clarity and are illustrated as each having a single-layer structure. However, as illustrated in FIG. 2, these conductor layers can each have a multilayer structure of 2 or more layers.

Figure 2:
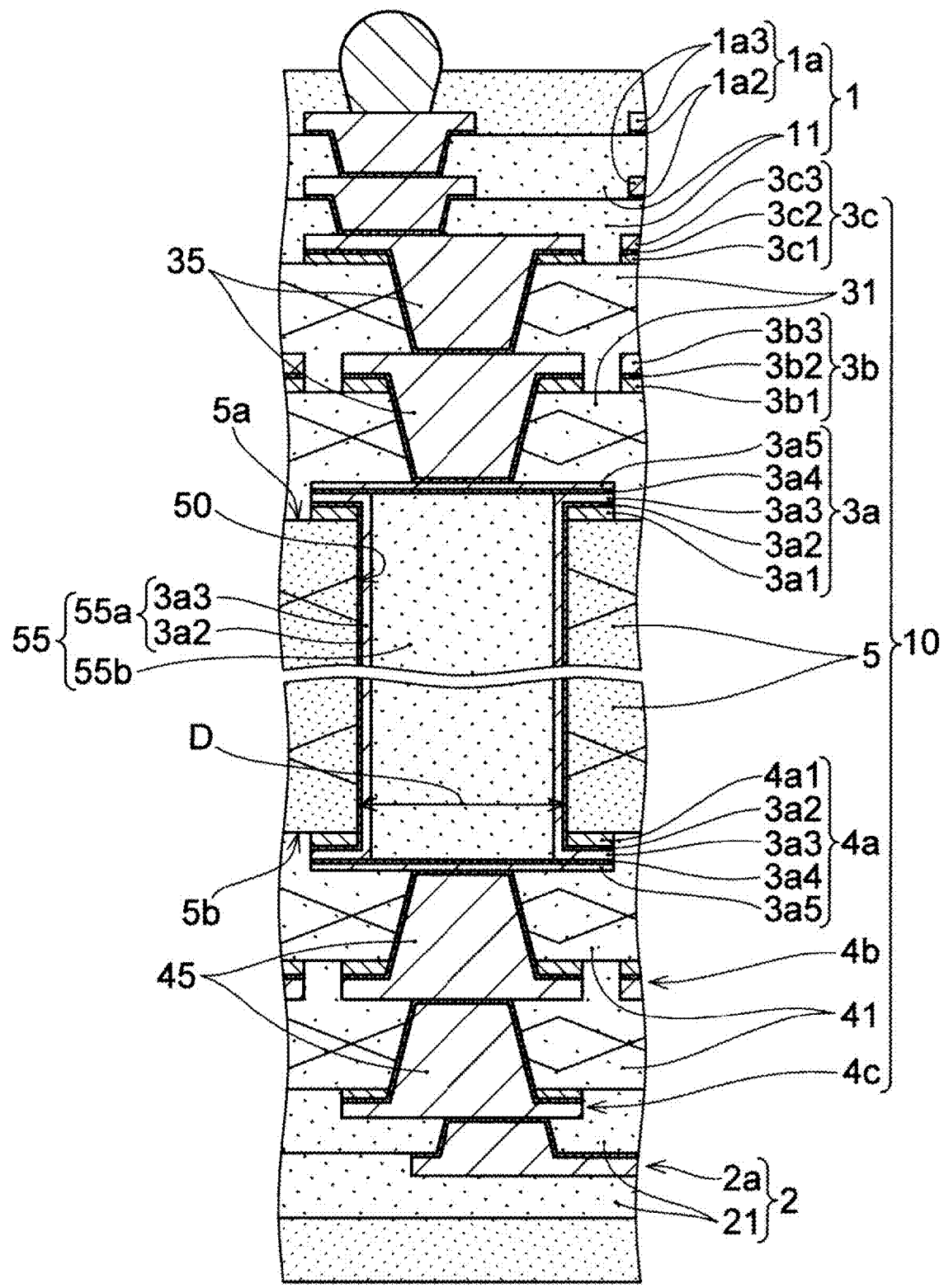
FIG. 2 illustrates an enlarged view of a portion (II) of FIG. 1.

With reference to FIG. 2, structures of the conductor layers, via conductors, and through-hole conductors 55 included in the wiring substrate 100 are further described in detail. FIG. 2 illustrates an enlarged view of a portion (II) of FIG. 1. In FIG. 2, a central portion of the core layer 5 is omitted.

As illustrated in FIG. 2, through holes 50 are provided in the core layer 5, and the through-hole conductors 55 are respectively formed in the through holes 50. Further, a metal foil (3a1) is laminated on the first base surface (5a) of the core layer 5, and a metal foil (4a1) is laminated on the second base surface (5b). Examples of the metal foils (3a1, 4a1) are copper foils. However, the material of the metal foils (3a1, 4a1) is not limited to copper. A seed film (3a2) and an electrolytic plating film (3a3) are formed on the metal foil (3a1), on the metal foil (4a1), and on inner wall surfaces of the through holes 50. The seed film (3a2) is, for example, a metal film formed by electroless plating, sputtering, or the like. The seed film (3a2) is formed of, for example, copper, nickel or the like and is used as a power feeding layer when the electrolytic plating film (3a3) is formed.

The conductor film (55a) of a two-layer structure forming the through-hole conductors 55 is formed by the seed film (3a2) and the electrolytic plating film (3a3) on the inner wall surfaces of the through holes 50. The filling material (55b) is filled on an inner side of the conductor film (55a) in each of the through holes 50. The filling material (55b) is filled inside each of the through-hole conductors 55. The through-hole conductors 55 include the conductor film (55a) which is responsible for the conductivity of the through-hole conductors 55 and the filling material (55b) which fills the inside of each of the through-hole conductors 55. The filling material (55b) is formed using an insulating material containing a resin such as an epoxy, acrylic, or phenol resin. Or, the filling material (55b) may be a conductive paste containing conductive particles such as silver particles or a solidified material of a conductive ink. Since the inside of each of the through-hole conductors 55 is filled with the filling material (55b), the via conductors (35, 45) can be laminated on the through-hole conductors 55. Further, as compared to a case where the inside of each of the through-hole conductors 55 is filled with the electrolytic plating film (3a3), the entire inside of each of the through-hole conductors 55 penetrating the relatively thick core layer 5 can be easily filled, and occurrence of voids or the like can be suppressed.

On the other hand, a seed film (3a4) and an electrolytic plating film (3a5) are further formed on the electrolytic plating film (3a3) on the first base surface (5a) and on the second base surface (5b). Similar to the seed film (3a2), the seed film (3a4) is formed by electroless plating, sputtering or the like using, for example, copper, nickel or the like, and is used as a power feeding layer when the electrolytic plating film (3a5) is formed.

The intra core substrate conductor layer (3a) is formed by the metal foil (3a1) on the first base surface (5a), and the seed film (3a2), the electrolytic plating film (3a3), the seed film (3a4) and the electrolytic plating film (3a5) which are formed in this order on the metal foil (3a1). Similarly, the intra core substrate conductor layer (4a) is formed by the metal foil (4a1) on the second base surface (5b), and the seed film (3a2), the electrolytic plating film (3a3), the seed film (3a4) and the electrolytic plating film (3a5) which are formed in this order on the metal foil (4a1). That is, the intra core substrate conductor layer (3a) and the intra core substrate conductor layer (4a) in the example of FIGS. 1 and 2 each have a five-layer structure excluding portions on the through-hole conductors 55. It may be possible to reduce a sheet resistance of each of the intra core substrate conductor layer (3a) and the intra core substrate conductor layer (4a).

End surfaces on the first base surface (5a) side and the second base surface (5b) side of the filling material (55b) filling the inside of each of the through-hole conductors 55 are each covered by two layers of metal films (the seed film (3a4) and the electrolytic plating film (3a5)). Even when the filling material (55b) is not conductive, the via conductors (35, 45) can be electrically connected to the intra core substrate conductor layer (3a) or the intra core substrate conductor layer (4a).

The intra core substrate conductor layer (3a) and the intra core substrate conductor layer (4a) are patterned to have predetermined conductor patterns, for example, after the formation of the electrolytic plating film (3a5). That is, the intra core substrate conductor layer (3a) and the intra core substrate conductor layer (4a) can be formed using a subtractive method.

As illustrated in FIG. 2, the intra core substrate conductor layer (3b), the intra core substrate conductor layer (3c), the intra core substrate conductor layer (4b) and the intra core substrate conductor layer (4c) each have a three-layer structure including a metal foil. That is, in the example of FIGS. 1 and 2, the intra core substrate conductor layers each include a metal foil. The intra core substrate conductor layer (3b) includes a metal foil (3b1), a seed film (3b2), and an electrolytic plating film (3b3). Further, the intra core substrate conductor layer (3c) includes a metal foil (3c1), a seed film (3c2), and an electrolytic plating film (3c3). The intra core substrate conductor layers (4b, 4c) respectively have the same structures as the intra core substrate conductor layers (3b, 3c). Examples of the metal foils (3b1, 3c1) are copper foils. However, the material of the metal foils (3b1, 3c1) is not limited to copper. Similar to the seed film (3a2) and the like, the seed films (3b2, 3c2) are formed by electroless plating, sputtering or the like using, for example, copper, nickel, or the like. The seed films (3b2, 3c2) are respectively used as power feeding layers when the electrolytic plating film (3b3) and the electrolytic plating film (3c3) are formed.

The intra core substrate conductor layer (3b), the intra core substrate conductor layer (3c), the intra core substrate conductor layer (4b), and the intra core substrate conductor layer (4c) are each formed using, for example, a subtractive method, or a modified semi-additive (MSAP: Modified Semi-Additive Process) method in which a metal foil is used.

On the other hand, the conductor layers (1a) in the first laminate 1 and the conductor layers (2a) in the second laminate 2 are each formed without using a metal foil. As illustrated in FIG. 2, the conductor layers (1a) each include a seed film (1a2) and an electrolytic plating film (1a3). The conductor layers (2a) have the same structure as the conductor layers (1a). Similar to the seed film (3b2) and the like, the seed film (1a2) is formed by electroless plating, sputtering or the like using, for example, copper, nickel or the like, and is used as a power feeding layer when the electrolytic plating film (1a3) is formed. The conductor layers of the first laminate 1 and the second laminate 2 of the example of FIG. 1 are each formed, for example, using a semi-additive (SAP: Semi-Additive Process) method in which a metal foil is not used.

In the example of FIG. 2, a thickness of each of the intra core substrate conductor layers is larger than a thickness of each of the conductor layers (1a) and the conductor layers (2a). That is, the conductor layers in the core substrate 10 can each have a low sheet resistance. Therefore, the conductor layers in the core substrate 10 can be used as good power planes, ground planes, or the like with little voltage drop in the conductor layers. That is, a path from a power source to a ground in the wiring substrate 100 can be strengthened. On the other hand, the relatively thin conductor layers (1a) and conductor layers (2a) can be provided with conductor patterns formed at fine pitches suitable for mounting, for example, a bare chip semiconductor (not illustrated in the drawings).

On the other hand, comparing the conductor layers in the core substrate 10, the thickness of each of the intra core substrate conductor layer (3c) and the intra core substrate conductor layer (4c) is smaller than the thickness of each of the intra core substrate conductor layers (the intra core substrate conductor layers (3a, 3b, 4a, 4b) in the example of FIG. 2) other than the intra core substrate conductor layer (3c) and the intra core substrate conductor layer (4c). As described above, the thickness of each of the insulating layer 11 in the first laminate 1 and the insulating layer 21 in the second laminate 2 covering the intra core substrate conductor layer (3c) or the intra core substrate conductor layer (4c) is smaller than the thickness of each of the intra core substrate insulating layers 31 and the intra core substrate insulating layers 41. By making the thickness of each of the intra core substrate conductor layer (3c) and the intra core substrate conductor layer (4c) relatively small, it may be possible to ensure a required spacing between each of the intra core substrate conductor layer (3c) and the intra core substrate conductor layer (4c) and the conductor layers (1a) or the conductor layers (2a).

On the other hand, the thickness of each of the intra core substrate conductor layer (3a) and the intra core substrate conductor layer (4a) each having a five-layer structure may be larger than the thickness of each of the intra core substrate conductor layers (the intra core substrate conductor layers (3b, 3c, 4b, 4c) in the example of FIG. 2) other than the intra core substrate conductor layer (3a) and the intra core substrate conductor layer (4a). As described above, it may be possible in particular to reduce the sheet resistance of each of the intra core substrate conductor layer (3a) and the intra core substrate conductor layer (4a), and a power plane, a ground plane or the like having particularly good characteristics can be provided on the both surfaces of the core layer 5.

The thickness of each of the conductor layers (1a) and the conductor layers (2a) is, for example, 10 μm or more and less than 20 μm. The conductor layers (1a) and the conductor layers (2a) that do nor each include a metal foil and can each have such a thickness can each include conductor patterns formed according to a wiring rule of (10 μm)/(10 μm) regarding a (minimum line width)/(minimum line spacing) (L/S).

On the other hand, among the intra core substrate conductor layers that can each have a metal foil, the intra core substrate conductor layers (3a, 4a) that are the innermost conductor layers and each have a five-layer structure each have a thickness of, for example, 20 μm or more and 80 μm or less. The intra core substrate conductor layers (3b, 4b) that are neither innermost conductor layers nor outermost conductor layers of the core substrate 10 each have a thickness of, for example, 20 μm or more and 80 μm or less. Further, the intra core substrate conductor layers (3c, 4c) that are the outermost conductor layers of the core substrate 10 each have a thickness, for example, 15 µm or more and 75 µm or less. The intra core substrate conductor layers that each include a metal foil can each have, for example, wiring patterns formed according to a wiring rule of (40 µm)/(40 µm) regarding a (minimum line width)/(minimum line spacing) (L/S).

Further, the through-hole conductors 55 each have a width (outer diameter) (D) of, for example, 100 µm or more and 250 µm or less. It is thought that the through-hole conductors 55 each having a width (outer diameter) in such a range each have a sufficiently low conductor resistance and are unlikely to each have an excessively large planar shape.

Figure 3:
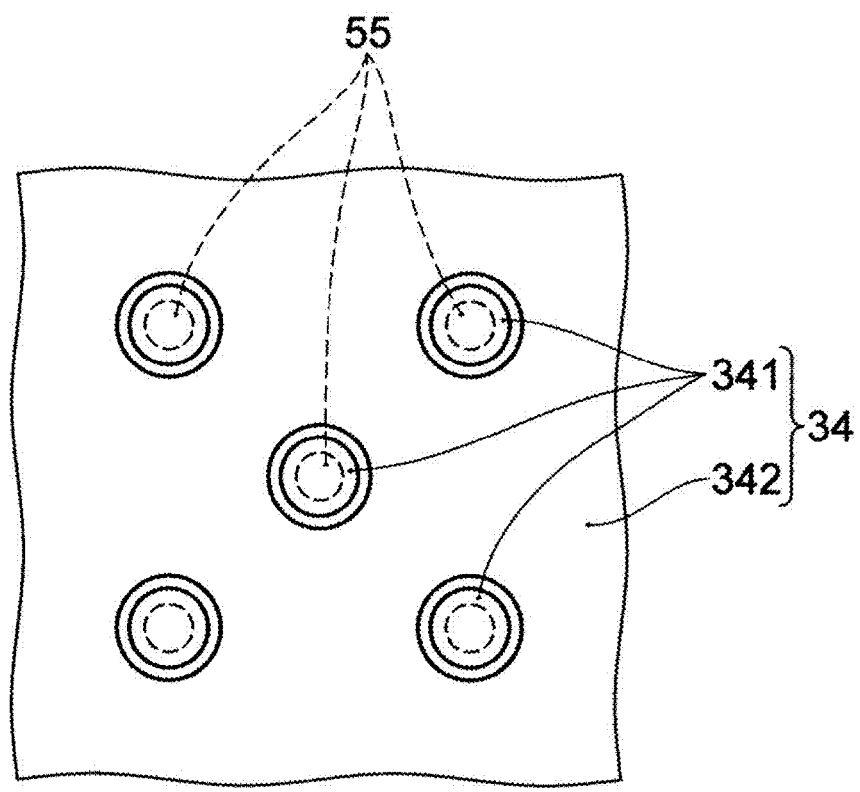
FIG. 3 is a plan view illustrating an example of conductor patterns of an intra core substrate conductor layer of the wiring substrate according to the embodiment.

With reference to FIG. 3, an example of the conductor patterns of the intra core substrate conductor layers of the wiring substrate 100 is described next. FIG. 3 illustrates a plan view of an example of conductor patterns that can be included in any one of the intra core substrate conductor layers included in the wiring substrate 100 (this any one intra core substrate conductor layer is referred to as an "intra core substrate conductor layer 34" in the description with reference to FIG. 3).

As illustrated in FIG. 3, the intra core substrate conductor layer 34 can include connecting parts 341, and a solid pattern 342 formed on substantially an entire surface of a region other than the connecting parts 341 in a plan view. The connecting parts 341 in the intra core substrate conductor layer 34 are portions that are respectively physically connected to the through-hole conductors 55 or the via conductors (35, 45) (in FIG. 3, as an example, the through-hole conductors 55 are indicated using broken lines). For example, when the intra core substrate conductor layer 34 is the intra core substrate conductor layer (3a) or the intra core substrate conductor layer (4a) in the example of FIG. 1, the connecting parts 341 are respectively physically connected to the through-hole conductors 55. When the intra core substrate conductor layer 34 is the intra core substrate conductor layer (3b) or the intra core substrate conductor layer (3c) in the example of FIG. 1, the connecting parts 341 are respectively physically connected to the via conductors 35. When the intra core substrate conductor layer 34 is the intra core substrate conductor layer (4b) or the intra core substrate conductor layer (4c) in the example of FIG. 1, the connecting parts 341 are respectively physically connected to the via conductors 45.

The connecting parts 341 are, for example, so-called through-hole lands (through-hole pads) or so-called via lands (via pads) that are respectively provided in the intra core substrate conductor layer 34 for the through-hole conductors 55 or the via conductors (35, 45). When the through-hole conductors 55 or the via conductors (35, 45) are so-called landless type conductors that do not have land patterns in the corresponding intra core substrate conductor layer 34, the connecting parts 341 may be portions that respectively overlap with the through-hole conductors 55 or the via conductors (35, 45) in the intra core substrate conductor layer 34 in a plan view.

In the example of FIG. 3, in the intra core substrate conductor layer 34, the connecting parts 341 and the solid pattern 342 are physically and electrically separated from each other. That is, when the solid pattern 342 is provided as the above-described power plane, ground plane or the like, any electrical signals other than those of a power source and a ground are transmitted through the through-hole conductors 55 and the via conductors (35, 45). A "solid pattern" is a conductor pattern formed so as to spread over a substantially entire blank region other than a region occupied by conductor patterns forming a desired electric circuit in an intra core substrate conductor layer. A ground potential or a predetermined potential other than a ground potential is applied to the solid pattern when the wiring substrate 100 is used.

In the wiring substrate 100 according to the present embodiment, one or more intra core substrate conductor layers included in the core substrate 10 may include only the connecting parts 341 and the solid pattern 342. That is, the core substrate 10 may include an intra core substrate conductor layer that includes only the connecting parts 341 and the solid pattern 342. In that case, for example, a good power plane, ground plane or the like can be provided in the core substrate 10.

Figure 4:
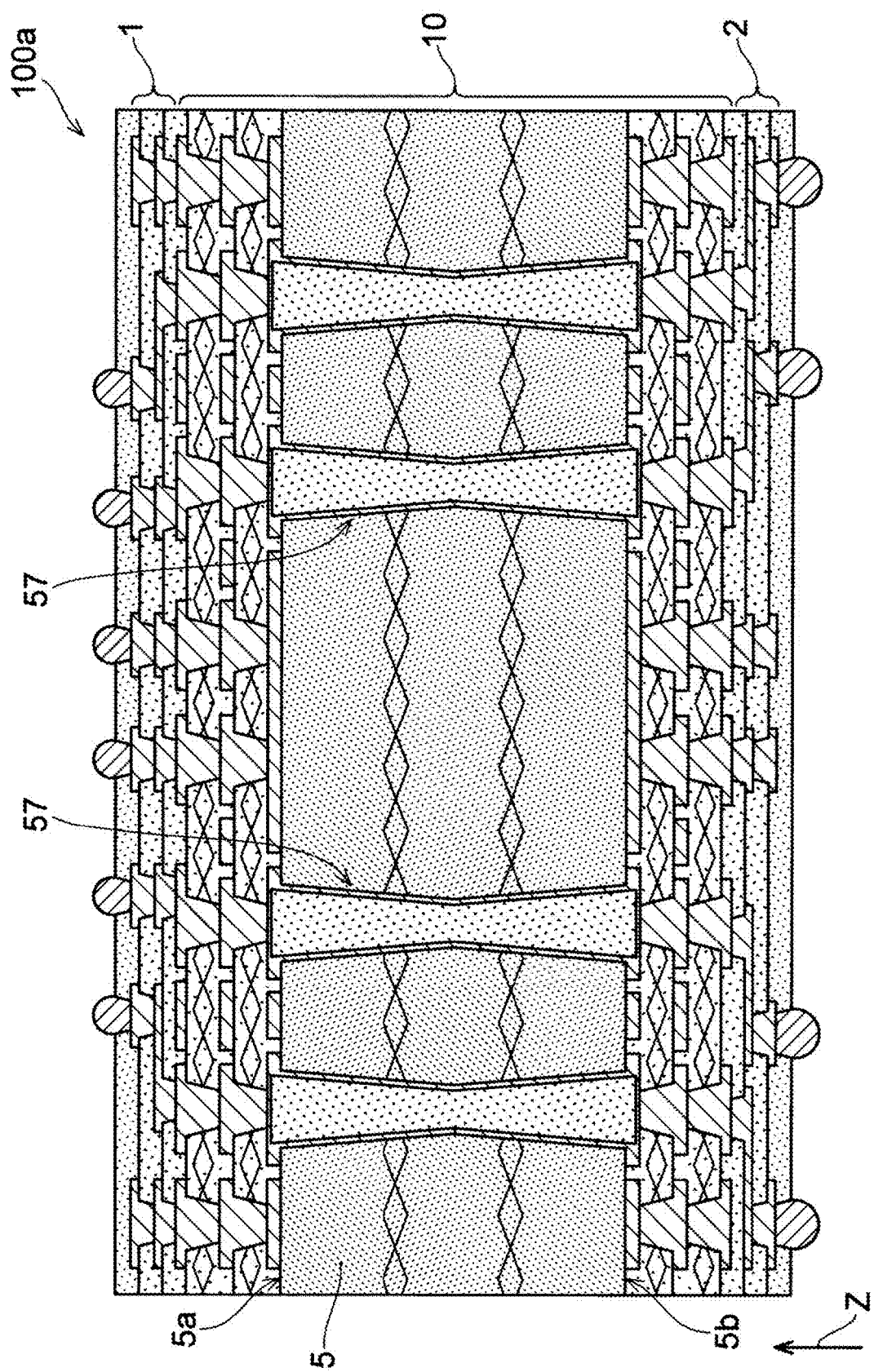
FIG. 4 is a cross-sectional view illustrating another example of the wiring substrate according to the embodiment.

FIGS. 4 and 5 respectively illustrate wiring substrates (100a, 100b) which are other examples of the wiring substrate according to the present embodiment. In the wiring substrate (100a) illustrated in FIG. 4, through-hole conductors 57 are provided each having a tapered shape that is reduced in diameter (tapers) from the first base surface (5a) and the second base surface (5b) toward a central portion of the core layer 5 in the Z direction. That is, the through-hole conductors 57 each have a width (outer diameter) that is the smallest at the central portion of the core layer 5 in the Z direction and is the largest at the first base surface (5a) or the second base surface (5b). In other words, the through-hole conductors 57 each have a neck portion having the smallest width (outer diameter) at the central portion in the Z direction.

The through-hole conductors 57 illustrated in FIG. 4 can be formed, for example, by irradiating $CO_2$ laser from the first base surface (5a) and from the second base surface (5b) to form through holes for forming the through-hole conductors 57 in the core layer 5. The wiring substrate (100a) in the example of FIG. 4 has the same structure as the wiring substrate 100 of FIG. 1 except for the through-hole conductors 57. A structural element that is the same as a structural element of the wiring substrate 100 of FIG. 1 is appropriately indicated in FIG. 4 using the same reference numeral symbol as in FIG. 1, and description thereof is omitted.

The wiring substrate (100b) illustrated in FIG. 5 includes the through-hole conductors 55 in the same way as in the wiring substrate 100 of FIG. 1, and further includes through-hole conductors 551 and through-hole conductors 552. The via conductors 35 and the via conductors 45 are not laminated on the through-hole conductors 551. That is, the through-hole conductors 551 are involved only in the connection between the conductor layer (the intra core substrate conductor layer (3a)) on the first base surface (5a) and the conductor layer (the intra core substrate conductor layer (4a)) on the second base surface (5b), and are not involved in the electrical connection in the Z direction between other intra core substrate conductor layers, and the conductor layers (1a) and the conductor layers (2a).

On the other hand, via conductors 15 are laminated on two via conductors 35 laminated on each of the through-hole conductors 552, and via conductors 25 are laminated on two via conductors 45 laminated on each of the through-hole conductors 552. As a result, the outermost conductor layers (the conductor layer (1a) and the conductor layer (2a) on the surface sides among the two conductor layers (1a) and the two conductor layers (2a)) of the wiring substrate (100b) are connected to each other by penetrating conductors 561. The penetrating conductors 561 are formed by laminates of the through-hole conductors 552, the via conductors (35, 45) laminated on the through-hole conductors 552, and the via conductors (15, 25) respectively laminated on the via conductors (35, 45), and each extend along the Z direction. Therefore, in the example of FIG. 5, the two outermost conductor layers of the wiring substrate (100b) can be connected to each other via a substantially shortest path.

The wiring substrate according to the present embodiment may include the through-hole conductors 551 on which the via conductors (35, 45) are not stacked as in the wiring substrate (100b) in the example of FIG. 5. Further, the wiring substrate according to the present embodiment may include the through-hole conductors 552 on which the via conductors (15, 25) are stacked in addition to the via conductors (35, 45). The wiring substrate (100b) in the example of FIG. 5 has the same structure as the wiring substrate 100 of FIG. 1 except for the through-hole conductors 551, the penetrating conductors 561, and their peripheral portions. A structural element that is the same as a structural element of the wiring substrate 100 of FIG. 1 is appropriately indicated in FIG. 5 using the same reference numeral symbol as in FIG. 1, and description thereof is omitted.

Next, using a case where the wiring substrate 100 of FIG. 1 is manufactured as an example, a method for manufacturing a wiring substrate according to an embodiment of the present invention is described with reference to FIGS. 6A-6G.

Figure 6A:
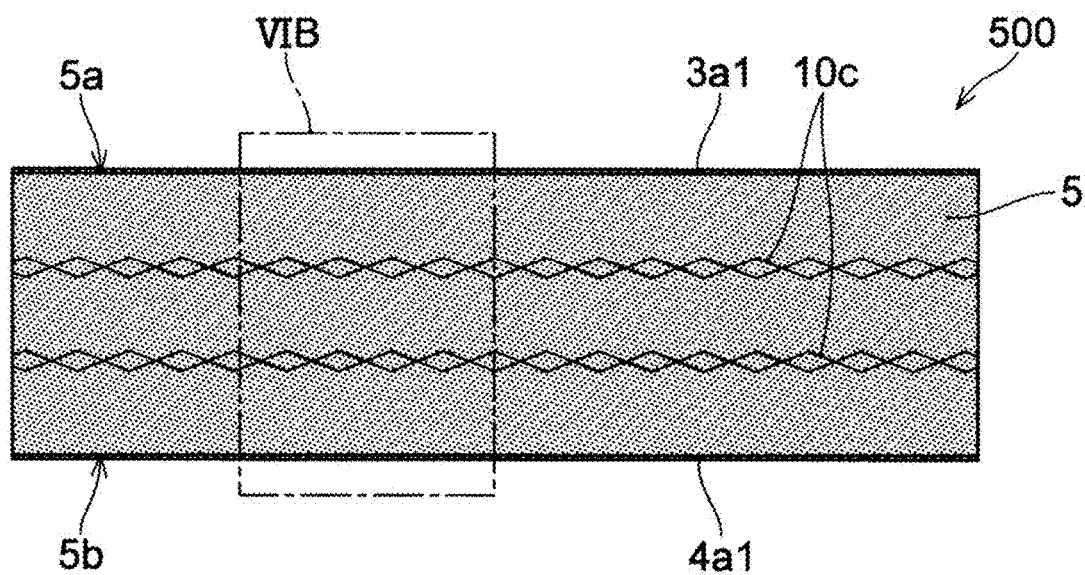
FIG. 6A is a cross-sectional view illustrating an example of a starting substrate in a manufacturing process of a wiring substrate according to an embodiment of the present invention.

As illustrated in FIG. 6A, a starting substrate 500 is prepared that includes an insulating layer as the core layer 5 of the wiring substrate 100 and the metal foils (3a1, 4a1) respectively laminated on both sides of the insulating layer. The insulating layer as the core layer 5 is formed, for example, using an insulating resin such as an epoxy resin, and includes a reinforcing material (10c). The metal foil (3a1) is laminated on the first base surface (5a) which is a surface on one side of the core layer 5, and the metal foil (4a1) is laminated on the second base surface (5b) which is a surface on an opposite side with respect to the first base surface (5a). For example, a double-sided copper clad laminated plate having a copper foil on each of both front and back sides thereof is prepared as the starting substrate 500.

Figure 6B:
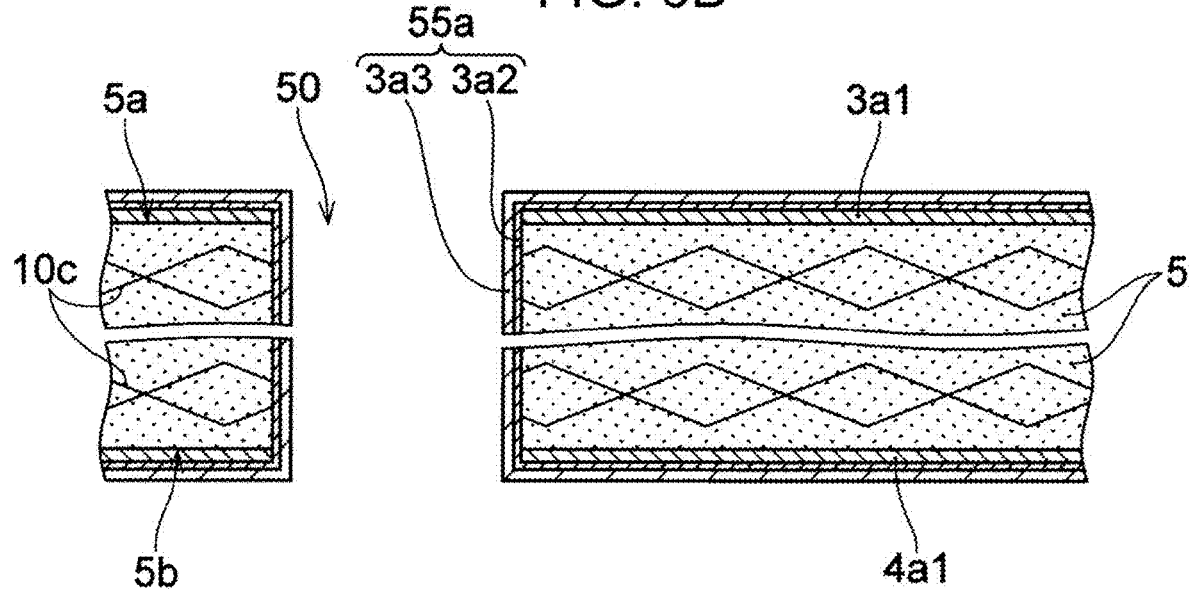
FIG. 6B is a cross-sectional view illustrating an example of a state after formation of conductor films of through-hole conductors in the manufacturing process of the wiring substrate according to the embodiment.
Figure 6C:
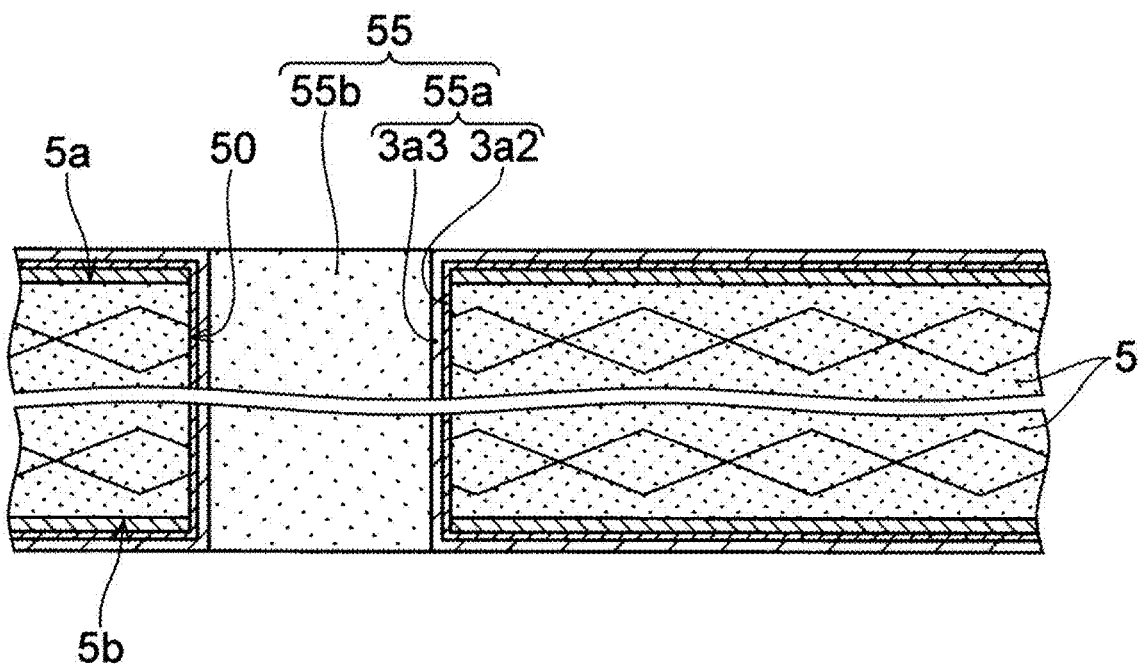
FIG. 6C is a cross-sectional view illustrating an example of a state after filling of the through-hole conductors in the manufacturing process of the wiring substrate according to the embodiment.
Figure 6D:
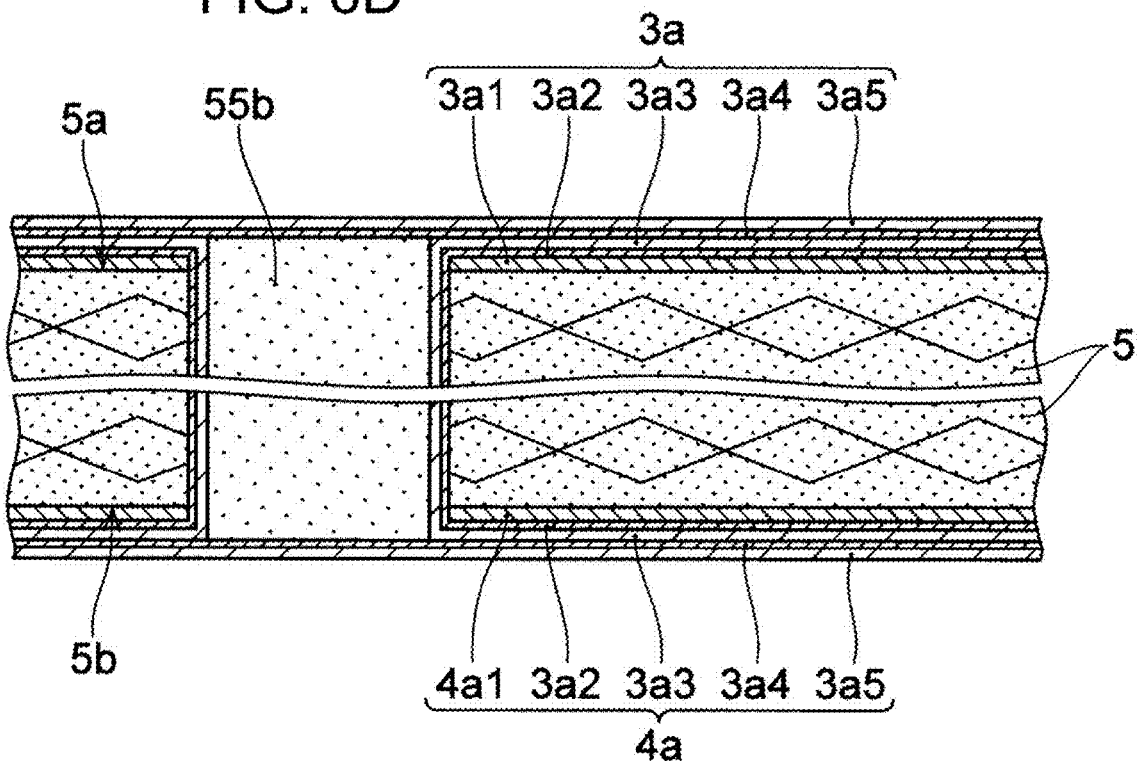
FIG. 6D is a cross-sectional view illustrating an example of a state after formation of conductor layers on a core layer in the manufacturing process of the wiring substrate according to the embodiment.

FIGS. 6B-6D each illustrate an enlarged view of a portion corresponding to a portion (VIB) of FIG. 6A. In FIGS. 6B-6D, a central portion of the core layer 5 in the thickness direction is omitted. The portion (VIB) of FIG. 6A includes a region where a through-hole conductor 55 is formed. In predetermined regions other than the portion (VIB), using the method described with reference to FIGS. 6B-6D, through-hole conductors 55 are formed at the same time as the through-hole conductor 55 formed in the portion (VIB).

As illustrated in FIG. 6B, the through holes 50 penetrating the core layer 5 and the metal foils (3a1, 4a1) are formed at predetermined positions where the through-hole conductors 55 are to be formed. The through holes 50 are formed, for example, by drilling. In this case, through holes 50 each having an inner wall surface substantially parallel to the thickness direction of the core layer 5 are likely to be formed. Further, the through holes 50 may also be formed by irradiating laser from one or both of the first base surface (5a) side and the second base surface (5b) side.

After the formation of the through holes 50, the seed film (3a2) is formed on the inner wall surfaces of the through holes 50, and on the metal foil (3a1) and on the metal foil (4a1). The seed film (3a2) is formed, for example, by electroless plating, sputtering, or the like. The seed film (3a2) is, for example, an electroless plating film formed of copper. However, the material of the seed film (3a2) is not limited to copper.

The electrolytic plating film (3a3) is formed on the seed film (3a2) by electrolytic plating using the seed film (3a2) as a power feeding layer. The electrolytic plating film (3a3) is formed of a metal such as copper deposited on the seed film (3a2). However, the material of the electrolytic plating film (3a3) is not limited to copper. The conductor film (55a) having a two-layer structure including the seed film (3a2) and the electrolytic plating film (3a3) and being responsible for the conductivity of the through-hole conductors 55 is formed on the inner wall surfaces of the through holes 50.

As illustrated in FIG. 6C, hollow spaces of the through holes 50 are filled with the filling material (55b). For example, a resin such as an epoxy, acrylic or phenol resin is injected from one or both of the first base surface (5a) side and the second base surface (5b) side. When necessary, an epoxy resin or the like supplied from one of the first base surface (5a) side and the second base surface (5b) side may be sucked from the other side through the through holes 50. Instead of an insulating resin such as an epoxy resin, the through holes 50 may be filled with a conductive paste containing conductive particles such as silver particles.

The insulating resin such as an epoxy resin or the conductive paste is solidified by heating when necessary to form the filling material (55b). The through-hole conductors 55 including the conductor film (55a) and the filling material (55b) are formed in the through holes 50. When necessary, end surfaces of the filling material (55b) on the first base surface (5a) side and the second base surface (5b) side are polished using any method such as chemical mechanical polishing. By the polishing, each of the two end surfaces of the filling material (55b) is preferably substantially flush with the surface of the electrolytic plating film (3a3) on the first base surface (5a) or the surface of the electrolytic plating film (3a3) on the second base surface (5b).

As illustrated in FIG. 6D, the seed film (3a4) and the electrolytic plating film (3a5) are formed in this order on the electrolytic plating film (3a3) and the filling material (55b). The seed film (3a4) and the electrolytic plating film (3a5) are formed, for example, using the same method as the seed film (3a2) and the electrolytic plating film (3a3). As a result, the intra core substrate conductor layer (3a) is formed on the first base surface (5a), and the intra core substrate conductor layer (4a) is formed on the second base surface (5b). The intra core substrate conductor layers (3a, 4a) each have a five-layer structure.

Figure 6E:
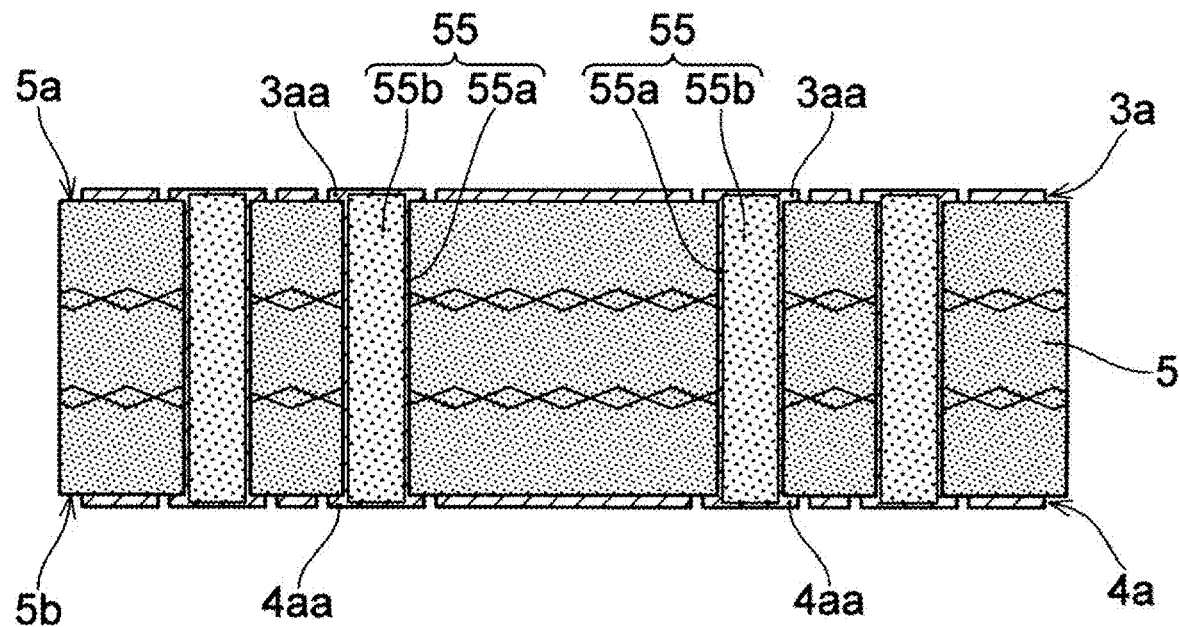
FIG. 6E is a cross-sectional view illustrating an example of a state after patterning of the conductor layers on the core layer in the manufacturing process of the wiring substrate according to the embodiment.

As illustrated in FIG. 6E, the intra core substrate conductor layers (3a, 4a) are patterned. For example, desired conductor patterns are provided in the intra core substrate conductor layers (3a, 4a) by etching using etching masks having openings at appropriate positions. The intra core substrate conductor layers (3a, 4a) can be formed in this way using a subtractive method. Predetermined conductor patterns (such as through-hole lands (3aa)) in the intra core substrate conductor layer (3a) and predetermined conductor patterns (such as through-hole lands (4aa)) in the intra core substrate conductor layer (4a) are electrically connected to each other via the through-hole conductors 55.

Figure 6F:
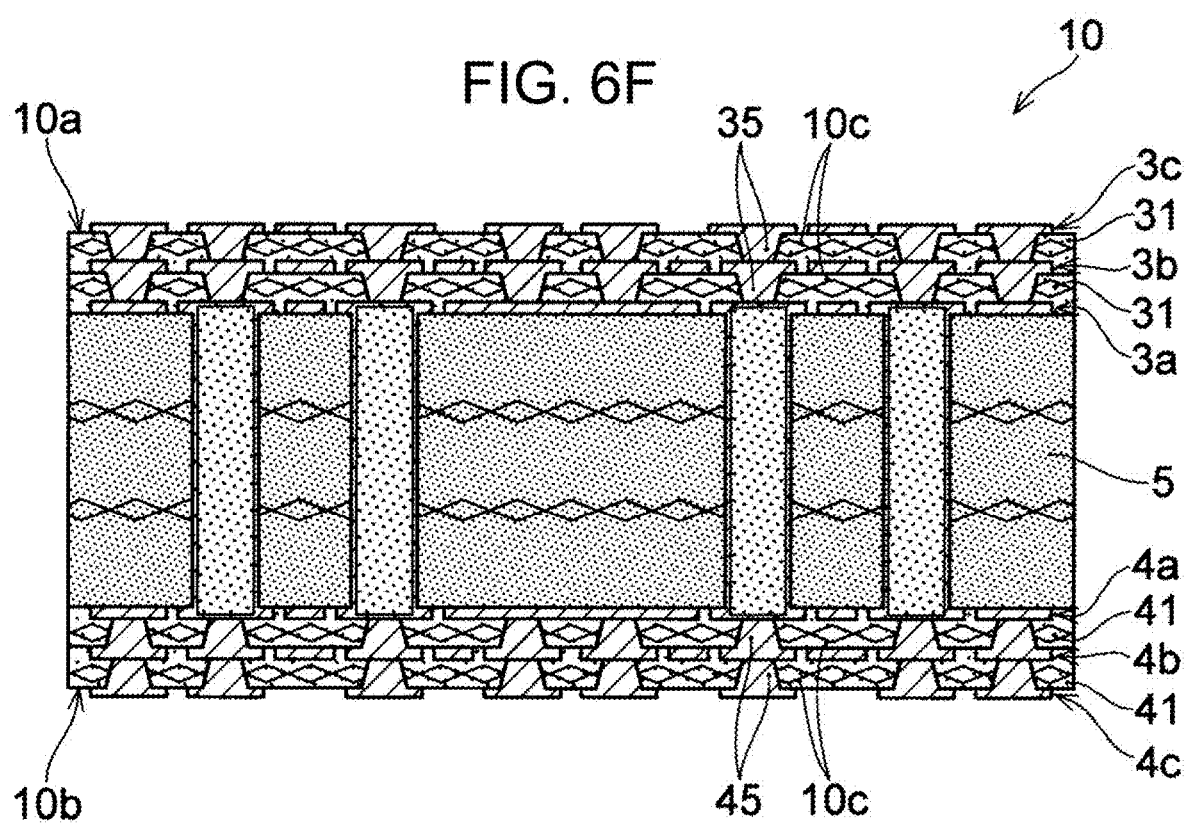
FIG. 6F is a cross-sectional view illustrating an example of a state after formation of a core substrate in the manufacturing process of the wiring substrate according to the embodiment.

As illustrated in FIG. 6F, the intra core substrate insulating layers (31, 41) and the intra core substrate conductor layers (3b, 3c, 4b, 4c) are formed. First, a prepreg containing a reinforcing material (10c) and a metal foil are thermo-compression-bonded onto each of the intra core substrate conductor layer (3a) and the intra core substrate conductor layer (4a), and the lower side intra core substrate insulating layers (31, 41) are respectively formed on the intra core substrate conductor layer (3a) and the intra core substrate conductor layer (4a). Through holes are formed at formation positions of the via conductors 35 in the lower side intra core substrate insulating layer 31 and the metal foil thereon and at formation positions of the via conductors 45 in the lower side intra core substrate insulating layer 41 and the metal foil thereon by, for example, irradiation of $CO_2$ laser. Then, the intra core substrate conductor layers (3b, 4b) having desired conductor patterns, and the via conductors 35 penetrating the lower side intra core substrate insulating layer 31 and the via conductors 45 penetrating the lower side intra core substrate insulating layer 41 are formed using a subtractive method or an MSAP method.

Further, the upper side intra core substrate insulating layer 31 and the upper side intra core substrate insulating layer 41 are formed using the same method as the lower side intra core substrate insulating layer 31 and the lower side intra core substrate insulating layer 41. Further, the intra core substrate conductor layers (3c, 4c) are formed using the same method as the intra core substrate conductor layers (3b, 4b). Further, the via conductors (35, 45) respectively penetrating the upper side intra core substrate insulating layers (31, 41) are formed using the same method as the via conductors (35, 45) respectively penetrating the lower side intra core substrate insulating layers (31, 41). As illustrated in FIG. 6F, formation of the core substrate 10 is completed.

Figure 6G:
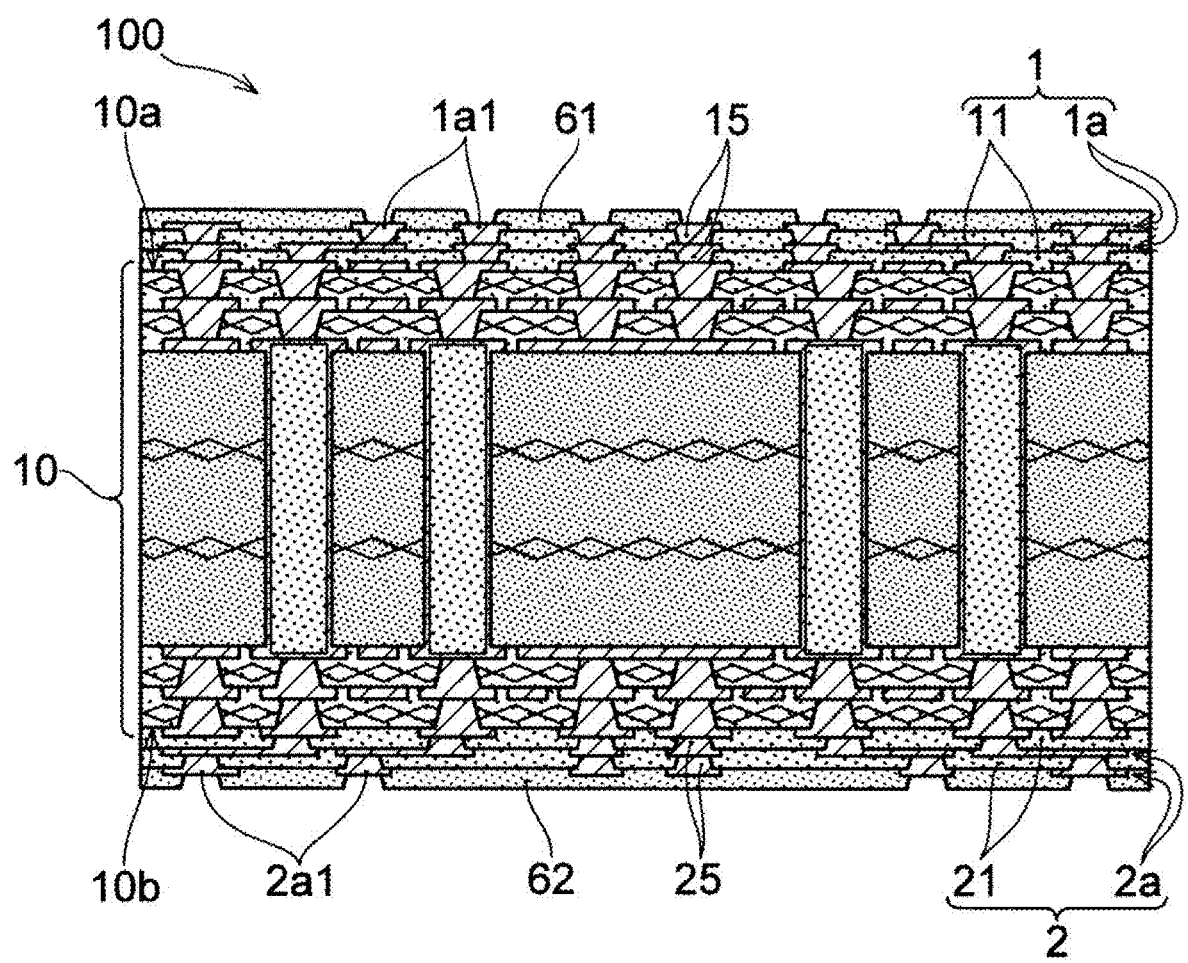
FIG. 6G is a cross-sectional view illustrating an example of a state after formation of first and second laminates in the manufacturing process of the wiring substrate according to the embodiment.

As illustrated in FIG. 6G, the first laminate 1 is formed on the first surface (10a) of the core substrate 10 and the second laminate 2 is formed on the second surface (10b). For example, a film-like insulating resin (such as an epoxy resin) that does not contain a reinforcing material is thermocompression-bonded to the first surface (10a) and to the second surface (10b), and thereby, the insulating layer 11 on the first surface (10a) side of the two insulating layers 11 and the insulating layer 21 on the second surface (10b) side of the two insulating layers 21 are formed. Through holes are formed at formation positions of the via conductors 15 or the via conductors 25 in the insulating layer 11 and the insulating layer 21 by, for example, irradiation of $CO_2$ laser. A seed film formed of a conductor such as copper is formed on inner walls of the through holes and on surfaces of the insulating layers (11, 21) by electroless plating, sputtering, or the like. The conductor layer (1a) and the conductor layer (2a) having desired conductor patterns, and the via conductors 15 and the via conductors 25 are formed by electrolytic plating using the seed film as a power feeding layer and using a plating resist having appropriate openings. That is, using a semi-additive method (SAP method) in which a metal foil is not used, the conductor layer (1a) on the first surface (10a) side of the two conductor layers (1a) and the conductor layer (2a) on the second surface (10b) side of the two conductor layers (2a) are formed. Together with the conductor layers (1a, 2a), the via conductors 15 penetrating the insulating layer 11 on the first surface (10a) side, and the via conductors 25 penetrating the insulating layer 21 on the second surface (10b) side are formed.

Further, the insulating layer 11 on the surface-layer side and the insulating layer 21 on the surface-layer side are formed using the same method as the insulating layer 11 on the first surface (10a) side and the insulating layer 21 on the second surface (10b) side. Further, the conductor layers (1a, 2a) on the surface-layer sides are formed using the same method as the conductor layer (1a) on the first surface (10a) side and the conductor layer (2a) on the second surface (10b) side. Further, the via conductors (15, 25) respectively penetrating the insulating layers (11, 21) on the surface-layer sides are formed using the same method as the via conductors 15 penetrating the insulating layer 11 on the first surface (10a) side and the via conductors 25 penetrating the insulating layer 21 on the second surface (10b) side. In this way, the first laminate 1 and the second laminate 2 are formed.

After that, the solder resist layer 61 is formed on the first laminate 1, and the solder resist layer 62 is formed on the second laminate 2. The solder resist layers (61, 62) are each formed by, for example, forming a resin layer containing a photosensitive epoxy resin or polyimide resin or the like and performing exposure and development using a mask having an appropriate pattern.

When the wiring substrate 100 in FIG. 1 is formed, further, the bumps 101 (see FIG. 1) are formed on the connection pads (1a1) and the connection pads (2a1) exposed in the openings of the solder resist layers (61, 62). The bumps 101 are formed by positioning solder balls and fixing the solder balls by melting the solder balls in a reflow furnace, or by forming metal plating films by electrolytic plating. Through the above processes, the wiring substrate 100 in the example of FIG. 1 is completed. It is also possible that the bumps 101 are not formed, and surface protective films (not illustrated in the drawings) formed of Au, Ni/Au, Ni/Pd/Au, solder, heat resistant preflux or the like are formed by electroless plating, solder leveling, spray coating, or the like.

The wiring substrate according to an embodiment of the present invention is not limited to those having the structures illustrated in the drawings and those having the structures, shapes, and materials exemplified in the present specification. For example, when the through-hole conductors 55 are filled using a conductive filling material, it is also possible that the intra core substrate conductor layers (3a, 4a) do not include the seed film (3a4) and the electrolytic plating film (3a5). Further, it is not always necessary to provide the solder resist layers (61, 62). It is not always necessary for the via conductors to each have a tapered shape that is reduced in width (outer diameter) toward the core layer 5.

In the multilayer printed wiring board of International Publication No. 2008/053833, an insulating base material forming the central insulating layer of the three insulating layers of the multilayer core substrate is used as a starting material for the multilayer printed wiring board. The three insulating layers have the same thickness, and the thickness of the insulating base material is about ⅓ the thickness of the multilayer core substrate. Therefore, the insulating base material is likely to warp in a manufacturing process of the multilayer printed wiring board, and warpage may occur in the multilayer printed wiring board after completion.

A wiring substrate according to an embodiment of the present invention includes: a multilayer core substrate having a first surface and a second surface on an opposite side with respect to the first surface; a first laminate including insulating layers and conductor layers alternately laminated on the first surface; and a second laminate including insulating layers and conductor layers alternately laminated on the second surface. The multilayer core substrate includes: a core layer that has a first base surface facing the first surface and a second base surface facing the second surface, and forms a central portion of the multilayer core substrate in a thickness direction; intra core substrate conductor layers and intra core substrate insulating layers that are alternately laminated on the first base surface and on the second base surface; through-hole conductors that penetrate the core layer and connect to each other the intra core substrate conductor layer on the first base surface and the intra core substrate conductor layer on the second base surface; and via conductors that are formed at positions overlapping the through-hole conductors in a plan view and penetrate the intra core substrate insulating layers. The core layer and the intra core substrate insulating layers are each formed of an insulating resin containing a reinforcing material. The insulating layers included in the first laminate or the second laminate are each formed of a resin that does not contain a reinforcing material. A thickness of the core layer is larger than a thickness of each of the intra core substrate insulating layers. The outermost conductor layers on the first surface side and the second surface side of the multilayer core substrate are connected to each other via laminates of the via conductors included in the intra core substrate insulating layers and the through-hole conductors.

According to an embodiment of the present invention, it may be possible to suppress warpage of a wiring substrate that includes a multilayer core substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising: a multilayer core substrate comprising a core layer, a plurality of intra core substrate conductor layers, and a plurality of intra core substrate insulating layers; a first laminate formed on a first surface of the multilayer core substrate and comprising a plurality of insulating layers and a plurality of conductor layers such that each of the insulating layers comprises a resin that does not contain a reinforcing material; and a second laminate formed on a second surface of the multilayer core substrate on an opposite side with respect to the first surface of the multilayer core substrate and comprising a plurality of insulating layers and a plurality of conductor layers such that each of the insulating layers comprises a resin that does not contain a reinforcing material, wherein the multilayer core substrate is formed such that the intra core substrate conductor layers are laminated on the core layer and formed on a first surface side and a second surface side of the multilayer core substrate and that the intra core substrate insulating layers are interposed between the intra core substrate conductor layers on the first and second surface sides of the multilayer core substrate, the multilayer core substrate includes a plurality of through-hole conductors penetrating through the core layer, and a plurality of via conductors formed on the plurality of through-hole conductors and penetrating through the plurality of intra core substrate insulating layers on the first and second surface sides of the multilayer core substrate such that the plurality of through-hole conductors and the plurality of via conductors connect outermost intra core substrate conductor layers on the first and second surface sides in the multilayer core substrate, and the multilayer core substrate is formed such that each of the core layer and intra core substrate insulating layers comprises an insulating resin comprising a reinforcing material and that the core layer has a thickness that is greater than a thickness of each of the intra core substrate insulating layers.

2. The wiring substrate according to claim 1, wherein the plurality of through-hole conductors in the core layer of the multilayer core substrate is formed such that a filling material comprising a resin is filled inside each of the through-hole conductors.

3. The wiring substrate according to claim 2, wherein the plurality of through-hole conductors in the core layer of the multilayer core substrate is formed such that each of the through-hole conductors has a metal film covering the filling material at an end on the first surface side and a metal film covering the filling material at an end on the second surface side.

4. The wiring substrate according to claim 2, wherein the plurality of intra core substrate conductor layers in the multilayer core substrate is formed such that each of the intra core substrate conductor layers includes a plurality of connecting portions and a solid pattern formed on substantially an entire surface of a respective one of the intra core substrate insulating layers other than the connecting portions such that the plurality of connecting portions is electrically separated from the solid pattern.

5. The wiring substrate according to claim 4, wherein the plurality of intra core substrate conductor layers includes at least one intra core substrate conductor layer consisting of the connecting portions and the solid pattern.

6. The wiring substrate according to claim 2, wherein each of the first and second laminates is formed such that each of the conductor layers does not include a metal foil, and the multilayer core substrate is formed such that each of the intra core substrate conductor layers includes a metal foil.

7. The wiring substrate according to claim 2, wherein the multilayer core substrate is formed such that each of the intra core substrate conductor layers has a thickness that is greater than a thickness of each of the conductor layers in the first laminate or the second laminate.

8. The wiring substrate according to claim 2, wherein the multilayer core substrate is formed such that each of the outermost intra core substrate conductor layers on the first and second surface sides has a thickness smaller than a thickness of each of the intra core substrate conductor layers other than the outermost intra core substrate conductor layers.

9. The wiring substrate according to claim 2, wherein the multilayer core substrate is formed such that the plurality of intra core substrate conductor layers includes an innermost intra core substrate conductor layer formed on a first surface of the core layer and an innermost intra core substrate conductor layer formed on a second surface of the core layer and at least one of the innermost intra core substrate conductor layers has a five-layer structure.

10. The wiring substrate according to claim 2, wherein the multilayer core substrate is formed such that each of the intra core substrate insulating layers has a thickness that is greater than a thickness of each of the insulating layers in the first laminate or the second laminate.

11. The wiring substrate according to claim 1, wherein the plurality of intra core substrate conductor layers in the multilayer core substrate is formed such that each of the intra core substrate conductor layers includes a plurality of connecting portions and a solid pattern formed on substantially an entire surface of a respective one of the intra core substrate insulating layers other than the connecting portions such that the plurality of connecting portions is electrically separated from the solid pattern.

12. The wiring substrate according to claim 11, wherein the plurality of intra core substrate conductor layers includes at least one intra core substrate conductor layer consisting of the connecting portions and the solid pattern.

13. The wiring substrate according to claim 1, wherein each of the first and second laminates is formed such that each of the conductor layers does not include a metal foil, and the multilayer core substrate is formed such that each of the intra core substrate conductor layers includes a metal foil.

14. The wiring substrate according to claim 1, wherein the multilayer core substrate is formed such that each of the intra core substrate conductor layers has a thickness that is greater than a thickness of each of the conductor layers in the first laminate or the second laminate.

15. The wiring substrate according to claim 1, wherein the multilayer core substrate is formed such that each of the outermost intra core substrate conductor layers on the first and second surface sides has a thickness smaller than a thickness of each of the intra core substrate conductor layers other than the outermost intra core substrate conductor layers.

16. The wiring substrate according to claim 1, wherein the multilayer core substrate is formed such that the plurality of intra core substrate conductor layers includes an innermost intra core substrate conductor layer formed on a first surface of the core layer and an innermost intra core substrate conductor layer formed on a second surface of the core layer and at least one of the innermost intra core substrate conductor layers has a five-layer structure.

17. The wiring substrate according to claim 1, wherein the multilayer core substrate is formed such that each of the intra core substrate insulating layers has a thickness that is greater than a thickness of each of the insulating layers in the first laminate or the second laminate.

18. The wiring substrate according to claim 1, wherein the multilayer core substrate is formed such that the thickness of the core layer is in a range of 10 times to 20 times the thickness of each of the intra core substrate insulating layers.

19. The wiring substrate according to claim 18, wherein the multilayer core substrate is formed such that the thickness of the core layer is in a range of 20 times to 50 times a thickness of each of the insulating layers in the first laminate or the second laminate.

20. The wiring substrate according to claim 1, further comprising:
   a first solder resist layer formed on the first laminate; and
   a second solder resist layer formed on the second laminate.

* * * * *